United States Patent [19]

Schober et al.

[11] Patent Number: 5,354,645

[45] Date of Patent: Oct. 11, 1994

[54] PROCESS FOR THE PRODUCTION OF FLEXOGRAPHIC PRINTING RELIEFS

[75] Inventors: Manfred Schober, Offenbach, Fed. Rep. of Germany; Bernard Feinberg, Englishtown; James A. Klein, Blackwood, both of N.J.

[73] Assignee: E. I. Du Pont de Nemours and Company, Wilmington, Del.

[21] Appl. No.: 876,812

[22] Filed: Apr. 29, 1992

Related U.S. Application Data

[63] Continuation of Ser. No. 604,986, Oct. 29, 1990, abandoned, which is a continuation of Ser. No. 392,536, Aug. 15, 1989, abandoned.

[30] Foreign Application Priority Data

Aug. 23, 1988 [DE] Fed. Rep. of Germany ....... 3828551

[51] Int. Cl.$^5$ ................................................ G03F 7/32
[52] U.S. Cl. .................................... 430/306; 430/309; 430/325; 430/331
[58] Field of Search ................. 430/306, 309, 325, 331

[56] References Cited

U.S. PATENT DOCUMENTS

| | | | |
|---|---|---|---|
| 3,907,695 | 9/1975 | Amidon et al. | 252/62.1 |
| 3,984,582 | 10/1976 | Feder et al. | |
| 3,987,215 | 10/1976 | Cortellino | 427/43 |
| 4,162,919 | 7/1979 | Richter et al. | 430/281 |
| 4,271,261 | 6/1981 | Shimizu et al. | 430/325 |
| 4,320,188 | 3/1982 | Heinz et al. | 430/281 |
| 4,323,636 | 4/1982 | Chen | 430/271 |
| 4,323,637 | 4/1982 | Chen et al. | 430/281 |
| 4,330,614 | 5/1982 | Moyer et al. | 430/325 |
| 4,394,435 | 7/1983 | Farber et al. | 430/287 |
| 4,547,455 | 10/1985 | Hiramoto et al. | 430/281 |
| 4,665,009 | 5/1987 | Brault | 430/325 |
| 4,680,251 | 7/1987 | Schober | 430/306 |
| 4,690,887 | 9/1987 | Fukuda et al. | 430/331 |
| 4,792,517 | 12/1988 | Klein et al. | 430/276 |
| 4,808,656 | 2/1989 | Kania et al. | 524/512 |

FOREIGN PATENT DOCUMENTS

| | | |
|---|---|---|
| 0076588 | 4/1983 | European Pat. Off. |
| 0101165 | 2/1984 | European Pat. Off. |
| 0221428 | 5/1987 | European Pat. Off. |
| 290917 | 11/1988 | European Pat. Off. |
| 2215090 | 10/1972 | Fed. Rep. of Germany |
| 2459156 | 11/1975 | Fed. Rep. of Germany |
| 3315118 | 11/1983 | Fed. Rep. of Germany |
| 2268284 | 11/1975 | France |
| 2319923 | 2/1977 | France |
| WO8600725 | 1/1986 | PCT Int'l Appl. ............ G03F 7/26 |

OTHER PUBLICATIONS

Patent Abstract of Japan, vol. 7, No. 121 (P-121) (1266) 25 May 1983.
Textbook of Polymer Science, Second Edition, pp. 391–393 (1971).
Photoresist: Materials and Processes, W. S. DeForest, pp. 31–32 (1975).

*Primary Examiner*—Christopher D. Rodee

[57] ABSTRACT

The invention relates to a process for producing flexographic printing reliefs by:

(a) forming at least one photopolymerizable layer on a support, said layer being crosslinkable by photopolymerization;
(b) imagewise exposing the layers to actinic radiation; and
(c) removing the noncrosslinked portions of the layers with developer solvents;

wherein the improvement comprises using developer solvents which have at least one component selected from the group consisting of: (a) diethylene glycol dialkyl ethers wherein the alkyl group has 1–5 carbon atoms; (b) acetic acid esters of alcohols selected from the group consisting of saturated alcohols having 6–10 carbon atoms and alkoxy substituted saturated alcohols having 6–10 carbon atoms; (c) carboxylic acid esters of acids having 6–10 carbon atoms and alcohols having 1–6 carbon atoms; and (d) esters of alkoxy substituted carboxylic acids wherein the acid has from 2–4 carbon atoms, the alkoxy substituent has from 1–4 carbon atoms, and alcohols having 1–4 carbon atoms.

9 Claims, No Drawings

PROCESS FOR THE PRODUCTION OF FLEXOGRAPHIC PRINTING RELIEFS

This is a continuation, division of application Ser. No. 07/604,986 filed Oct. 29, 1990, now abandoned, which is a continuation of application Ser. No. 07/392,536 filed Aug. 15, 1989 now abandoned.

FIELD OF THE INVENTION

This invention relates to a process for the production of flexographic printing reliefs and, more particularly, to the use of non-perchloroethylene developer solvents.

BACKGROUND OF THE INVENTION

The production of photopolymer reliefs for flexographic printing typically involves imagewise exposing the photosensitive layer of an element with ultraviolet radiation. Unexposed areas are washed off using a suitable solvent. Solvent is removed by evaporation and, if necessary, the surface is treated to remove tack.

Generally, aqueous alkaline solutions or organic solvents such as saturated hydrocarbons, aromatic hydrocarbons, aliphatic ketones, and especially chlorinated hydrocarbons such as trichloroethylene, tetrachloroethylene, or trichloroethane either by itself or admixed with low molecular weight alcohols constitute suitable developer solvents depending upon the binder used to formulate the photosensitive layer.

Known developer solvents exhibit a number of undesirable properties. Frequently, extended wash-off times are needed which leads to swelling of the imagewise exposed photosensitive layer and to dissolution of the crosslinked areas due to the lengthy development time. Lengthy drying times are usually needed to completely remove the developer solvent. Otherwise, a defective printing surface results because it is too soft. Another disadvantage to using some solvents is their high flammability which requires that the plant be explosion proof. It is very expensive to ensure that a plant is explosion-proof. Other solvents such as chlorinated hydrocarbons are extremely toxic and present serious safety and disposal problems.

Journal of the Electrochemical Society, pages 1628–1630, Vol. 126, No. 9 (Sep. 1979), and Journal of Vacuum Science and Technology, pages 1121–1126, Vol. 19, No. 4 (Nov./Dec. 1981) cited in PCT Application No. WO 86/00725 which was published on Jan. 30, 1986, describe photoresists containing chloromethylated polystyrene which are developed by dipping the resists in acetic acid-n-pentyl ester and subsequently treating with isopropyl alcohol.

German Preliminary Published Application No. 3,315,118 describes mixtures of good solvents such as acetic acid alkyl esters having one to five carbon atoms and poor solvents such as ethylene glycol alkyl ethers as developer solvents for radiation-sensitive negative protective coatings made of an aromatic vinyl polymer.

The low molecular weight acetic acid esters described above are unsuitable developer solvents because they pose health, safety and environmental problems. Furthermore, it is known that low molecular weight acetic acid esters cause printing reliefs to swell.

European Patent Application Publication No. 221,428 which was published on May 13, 1987 describes mixtures of propylene glycol alkyl ethers and propylene glycol ether acetates, preferably in a 1:1 ratio, as coating removal agents for photoresists, particularly for those resists containing novolak resins. No differentiation between exposed and unexposed areas is needed because the entire hardened resist composition is removed. Swelling also does not present a problem as no resist material remains.

A developing process for photosensitive coating is described in German Patent 2,459,156 which was published on Nov. 6, 1975. The photopolymers are degraded by exposure to ultraviolet radiation and the low molecular weight photodegradation products are dissolved out in the developing step. Development is carried out using alkyl acetates or ketones having seven to nine carbon atoms at an elevated temperature. At room temperature, the solvents used, e.g., isoamyl acetate, exhibit poor dissolution properties. n-Hexyl acetate is also generally designated as a poor solvent.

Accordingly, there is a need for a process to produce flexographic printing reliefs using developer solvents which remove the non-crosslinked portions of the imagewise exposed layers rapidly with good edge sharpness and without causing the photosensitive layer to swell or removal of the exposed areas. These reliefs must be dried quickly and completely resulting in a stable, uniform printing surface. Furthermore, the wash out system must be environmentally safe and not pose any disposal problems. The system should be easy to handle and monitor.

SUMMARY OF THE INVENTION

The invention relates to a process for producing flexographic printing reliefs by:

(a) forming at least one photopolymerizable layer on a support, said layer being crosslinkable by photopolymerization;

(b) imagewise exposing the layers to actinic radiation; and (c) removing the noncrosslinked portions of the layers with developer solvents;

wherein the improvement comprises using developer solvents which have at least one component selected from the group consisting of: (a) diethylene glycol dialkyl ethers wherein the alkyl group has 1-5 carbon atoms; (b) acetic acid esters of alcohols selected from the group consisting of saturated alcohols having 6-10 carbon atoms and alkoxy substituted saturated alcohols having 6-10 carbon atoms; (c) carboxylic acid esters of acids having 6-10 carbon atoms and alcohols having 1-6 carbon atoms; and (d) esters of alkoxy substituted carboxylic acids wherein the acid has from 2-4 carbon atoms, the alkoxy substituent has from 1-4 carbon atoms, and alcohols having 1-4 carbon atoms.

In another embodiment this invention also concerns a process for producing flexographic printing reliefs by:

(a) forming at least one photopolymerizable layer on a support, said layer being crosslinkable by photopolymerization;

(b) imagewise exposing the layers to actinic radiation; and (c) removing the noncrosslinked portions of the layers with developer solvents;

wherein the improvement comprises using developer solvents which have at least one component selected from the group consisting of: (a) diethylene glycol dialkyl ethers wherein the alkyl group has 1-5 carbon atoms; (b) acetic acid esters of alcohols selected from the group consisting of branched saturated alcohols having 6-10 carbon atoms and alkoxy substituted saturated alcohols having 6-10 carbon atoms; and (c) carboxylic acid esters which are formed by the reaction of acids having 6–10 carbon atoms with alcohols having 1–6 carbon atoms.

DETAILED DESCRIPTION OF THE INVENTION

Developer solvents suitable for practicing the invention include (a) diethylene glycol dialkyl ethers wherein the alkyl group has 1–5 carbon atoms, (b) acetic acid esters of alcohols selected from the group consisting of saturated alcohols having 6–10 carbon atoms and alkoxy substituted saturated alcohols having 6–10 carbon atoms, (c) carboxylic acid esters of acids having 6–10 carbon atoms and alcohols having 1–6 carbon atoms, or (d) esters of alkoxy substituted carboxylic acids wherein the acid has from 2–4 carbon atoms, the alkoxy substituent has from 1–4 carbon atoms, and alcohols having 1–4 carbon atoms.

These solvents can be used separately or in combination with one another. In practicing the invention, it is important that at least one of the aforementioned solvents be used.

The developer solvents of the invention enable rapid and precise removal or washing-off of the imagewise exposed flexographic printing reliefs because the solvents are compatible with the photopolymerizable layer. This was surprising and unexpected because such solvents are expected to cause the exposed areas to swell and to be extremely difficult to remove during drying as these solvents have low vapor pressures. Conventionally, these solvents are used in the printing and varnish industries as retardants to prevent rapid drying which results from using the desired, easily evaporated solvents.

It has been found that the developer solvents of the invention can be removed completely in a relatively short amount of time even though they have relatively low vapor pressures compared to perchloroethylene which has a vapor pressure of 19 mbar. Thus, flexographic printing reliefs can be produced much more quickly using the developer solvents described herein.

This is very important in the printing industry because very frequently customers request rush jobs which need to be completed quickly with good quality. Heretofore, the protracted drying of the printing reliefs was halted before going to completion in order to comply with the rush request. The resulting relief was swollen and all the solvents were not removed. Therefore, the relief did not have the requisite hardness and thickness needed for printing. The relief was not mechanically stable and, thus, severe abrasion occurred when it was squeezed. This leads to more rapid destruction of the printing relief, reduces the useful life of the relief, lowers printing stability and reduces printing quality while raising printing costs. All of these disadvantages are avoided by using the developer solvents of the invention.

The low vapor pressure of the solvents of the invention offer an additional advantage because they are more environmentally safe than the developer solvents which were previously used. Furthermore, safety conditions are enhanced because these solvents have a relatively high flash point.

As was described above, at least one of the following solvents must be present: diethylene glycol ethers, acetic acid esters, or other carboxylic acid esters or a combination thereof.

Suitable diethylene glycol ethers include diethers whose alkyl substituent has 1–5 carbon atoms and, preferably, 2–4 carbon atoms. Diethyl ethers are especially preferred in practicing the invention.

Acetic acid esters are prepared by reacting acetic acid with saturated alcohols having 6–10 carbon atoms or alkoxy substituted saturated alcohols having 6–10 carbon atoms. The following can be used to practice the invention: acetic acid-3,5,5trimethylhexyl ester, acetic acid-2-butoxyethyl ester, acetic acid-2-ethylbutyl ester, acetic acid-2-cyclohexylethyl ester, acetic acid-2-ethylhexyl ester, or mixtures thereof. The preferred esters are acetic acid-3,5,5-trimethylhexyl ester or a mixture of nonyl acetate esters.

Carboxylic acid esters of acids having 6–10 carbon atoms and alcohols having 1–6 carbon atoms can be used. Such esters include octanoic acid ethyl ester, hexanoic acid-2-pentyl ester, and nonanoic acid ethyl ester.

Esters of alkoxy substituted carboxylic acids having from two to four carbon atoms wherein the alkoxy substituent has from 1 to 4 carbon atoms and alcohols having 1–4 carbon atoms can also be used. Such esters include ethyl 3-ethoxypropionate.

The developer solvents of the invention can be used either undiluted or diluted with 5–40% of alcohol, such as butanol or benzyl alcohol, in order to dissolve the polyamide layer that is frequently applied to the printing plate to avoid surface tack. These developer solvents can be used in any developing apparatus and can be used with a wide variety of Photopolymerizable compositions.

The developer solvents of the invention are particularly suitable for photosensitive materials that contain at least one thermoplastic elastomer block copolymer as a binder, at least one addition-polymerizable compound that is terminally ethylenically unsaturated, a photoinitiator or photoinitiating system and, optionally, other additives such as plasticizers, dyes, fillers, antioxidants, inhibitors, etc. Suitable binders include, Polystyrene-polybutadiene-polystyrene block copolymers or Polystyrene-polyisoprene-polystyrene block copolymers. These binders and others are described in German Patent 2,215,090.

The photopolymerizable materials can be applied onto commercial supports using conventional techniques. Such methods are described in German Patent 2,215,090. After development with solvents of the invention, the printing reliefs are dried and, optionally, subject to post development treatments or post-exposure.

The invention is illustrated in the following

Examples:

EXAMPLE 1

Flexographic printing plates (2.79 mm thick) were produced according to Example 5 of German Patent 2 215 090, were exposed through an original for 5 minutes with a 40-W UV lamp, and then were treated with the washoff solvents under test by means of a brush processor at room temperature for 5 min. The plates were then dried for 30 min. at 60° C. and the relief depth and amount of swelling were determined. The results are summarized in Table 1. The various solvents listed in the Table are as follows: (1) perchloroethylene (the control), (2) diethylene glycol dimethyl ether, (3) diethylene glycol diethyl ether, (4) diethylene glycol dibutyl ether, (5) acetic acid-2-butoxyethyl ester, (6) acetic acid-2-ethylbutyl ester, (7) acetic acid-2-ethylhexyl ester, (8) acetic acid-2-cyclohexylethyl ester, (9) octanoic acid ethyl ester, (10) hexanoic acid-2pentyl ester, (11) nonanoic acid ethyl ester, and (12) acetic acid-3,5,5-trimethylhexyl ester.

TABLE 1

| Solvent | Relief Depth (mm) | Amt. of swelling after washing (mm) | Amt. of Swelling after drying (mm) |
|---|---|---|---|
| (1) | 1.00 | 3.20 | 2.99 |
| (2) | 0.79 | 2.84 | 2.80 |
| (3) | 1.34 | 2.85 | 2.81 |
| (4) | 1.00 | 2.82 | 2.81 |
| (5) | 0.53 | 2.83 | 2.81 |
| (6) | 0.79 | 2.87 | 2.82 |
| (7) | 0.66 | 2.82 | 2.80 |
| (8) | 0.59 | 2.82 | 2.81 |
| (9) | 0.72 | 2.84 | 2.81 |
| (10) | 0.82 | 2.85 | 2.82 |
| (11) | 0.67 | 2.86 | 2.85 |
| (12) | 0.70 | 2.84 | 2.81 |

As can be seen from Table 1, the relief depths for all solvents of the invention are above the minimum practical requirement of 0.5 mm. The amount of swelling is in all cases lower than with perchloroethylene, whereby in addition the difference between the amount of swelling directly after washing and that after drying is substantially lower, i.e., the solvent is removed from the material considerably faster and, thus, the mechanical stability is regained more rapidly.

EXAMPLE 2

Four flexographic printing plates were produced and exposed as in Example 1. Then, the washoff time required to achieve a relief depth of 1 mm was determined. The printing reliefs were then dried at 60° C. until changes in the plate thickness were no longer observed.

TABLE 2

| Solvent | Wash-off time (min) | Drying Time (hr) | Total Time (hr/min) |
|---|---|---|---|
| (1) | 5 | 5 | 5 hr 5 min |
| (3) | 10 | 2 | 2 hr 10 min |
| (5) | 10 | 3 | 3 hr 10 min |
| (7) | 7 | 1 | 1 hr 7 min |
| (10) | 6 | 2 | 2 hr 6 min |

Table 2 shows that the production time of flexographic printing reliefs can be shortened considerably by using the developer solvents of the invention.

Printing reliefs which are made using the wash-off solvents of the invention exhibit a minimal degree of swelling and require a much shorter drying time compared to the drying time required by conventional solvents.

20–30% of butanol is generally added to the solvents in practice, in order to dissolve the polyamide anti-tack layer of the plates. This additive reduces the required drying time for conventional solvents and solvents of the invention by 10–15%.

EXAMPLE 3

Three printing forms based on other binder systems were produced and tested as in Example 1: (a) as in Example 2 of U.S. Pat. No. 4,320,180 (A-B-C block copolymer having two different elastomer blocks); (b) as in Example 8 of U.S. Pat. No. 4,197,130 (radial block copolymers); and (c) as in Example 3 of European Patent 76,588 (polybutadiene). All three printing reliefs showed a good relief depth and low swelling for the wash-off solvents of the invention.

TABLE 3

| Plate | Relief Depth (mm) | Amt. of swelling after washing (mm) | Amt. of Swelling after drying (mm) |
|---|---|---|---|
| Type (a) | | | |
| (1) | 0.84 | 3.10 | 2.92 |
| (4) | 0.63 | 2.84 | 2.81 |
| (6) | 0.61 | 2.84 | 2.81 |
| (9) | 0.74 | 2.86 | 2.83 |
| Type (b) | | | |
| (1) | 1.10 | 3.30 | 2.93 |
| (4) | 0.92 | 2.87 | 2.83 |
| (6) | 0.94 | 2.86 | 2.82 |
| (9) | 1.01 | 2.88 | 2.84 |
| Type (c) | | | |
| (1) | 0.73 | 3.00 | 2.89 |
| (4) | 0.66 | 2.85 | 2.81 |
| (6) | 0.58 | 2.84 | 2.81 |
| (9) | 0.61 | 2.83 | 2.80 |

EXAMPLE 4

Cyrel ® HL plates were processed for 7.5 minutes in 75/25 w/w mixture of ethyl 3-ethoxypropionate ($CH_3CH_2OCH_2CH_2COOC_2H_5$) and 2-ethyl hexanol. The purpose of the alcohol was to remove the polyamide anti-stick layer. (Without the alcohol, the wash time would have been approximately 5 minutes.)

| | |
|---|---|
| Exposure time: | 6 minutes |
| Original plate thickness: | 2.85 mm |
| After 1 hr drying at 60° C.: | 2.88 mm |
| Depth of relief: | 0.90 mm |

These results show that this solvent gave good washout, low swelling, and was fast drying.

What is claimed is:

1. In a process for producing flexographic printing reliefs by:
   (a) forming at least one photopolymerizable layer on a support, said layer containing a binder, selected from the group consisting of thermoplastic elastomeric block copolymers, A-B-C block copolymers having two different elastomeric blocks, radial block copolymers and homopolymers of butadiene, and said layer being crosslinkable by photopolymerization;
   (b) imagewise exposing the layers to actinic radiation; and
   (c) removing the noncrosslinked portions of the layers with at least one developer solvent;
   wherein the improvement comprises using at least one developer solvent which has at least one component selected from the group consisting of: (a) diethylene glycol dialkyl ethers wherein the alkyl group has 1–5 carbon atoms; (b) acetic acid esters of alcohols selected from the group consisting of saturated alcohols having 6–10 atoms and alkoxy substituted saturated alcohols having 6–10 carbon atoms (c) carboxylic acid esters of acids having 6–10 carbon atoms and alcohols having 1–6 carbons; and (d) esters of alkoxy substituted carboxylic acids wherein the acid has from 2–4 carbon atoms, the alkoxy substituent has from 1–4 carbon atoms, and an alcohol has from 1–4 carbon atoms.

2. A process according to claim 1 wherein the developer solvent is ethyl 3-ethoxy-propionate.

3. A process according to claim 1 wherein the developer solvent contains at least one component selected from the group consisting of nonyl acetic acid esters, acetic acid-2-ethylhexyl ester and diethylene glycol diethyl ether.

4. A process according to claim 1 wherein the photopolymerizable layer contains a thermoplastic elastomeric block copolymer.

5. A process according to claim 1, 2, or 3 wherein the developer solvent is diluted with at least one alcohol.

6. In a process for producing flexographic printing reliefs by:

(a) forming at least one photopolymerizable layer on a support, said layer containing a binder selected from the group consisting of thermoplastic elastomeric block copolymers, A-B-C block copolymers having two different elastomeric blocks, radial block copolymers and homopolymers of butadiene and said layer being crosslinkable by photopolymerization;

(b) imagewise exposing the layers to actinic radiation; and (c) removing the noncrosslinked portions of layers with at least one developer solvent;

wherein the improvement comprises using at least one developer solvent which has at least one component selected from the group consisting of: (a) diethylene glycol diaklyl ethers wherein the alkyl group has 1-5 carbon atoms; (b) acetic acid esters of alcohols selected from the group consisting of branched saturated alcohols having 6-10 carbon atoms and alkoxy substituted saturated alcohols having 6-10 carbon atoms; and (c) carboxylic acid esters of acids having 6-10 carbon atoms and alcohols having 1-6 atoms.

7. A process according to claim 6 wherein the developer solvent contains at least one component selected from the group consisting of acetic acid-3,5,5-trimethylhexyl ester, acetic acid-2-ethylhexyl ester and diethylene glycol diethyl ether.

8. A process according to claim 6 wherein the photopolymerizable layer contains a thermoplastic elastomeric block copolymer.

9. A process according to claim 6 or 7 wherein the developer solvent is diluted with at least one alcohol.

* * * * *